United States Patent [19]

Hayakawa et al.

[11] 4,247,590
[45] Jan. 27, 1981

[54] CERAMIC PLATE FOR SUPPORTING A SEMICONDUCTOR WAFER

[75] Inventors: Masao Hayakawa, Kyoto; Takamichi Maeda, Yamatokoriyama; Teruo Horii; Masao Kumura, both of Nara; Yasunori Chikawa, Wakayama, all of Japan

[73] Assignee: Sharp Kabushiki Kaisha, Osaka, Japan

[21] Appl. No.: 858,636

[22] Filed: Dec. 8, 1977

[30] Foreign Application Priority Data

Dec. 8, 1976 [JP] Japan .......................... 51-165080[U]

[51] Int. Cl.³ ..................... B32B 3/00; B32B 3/26
[52] U.S. Cl. .................... 428/210; 228/6 A; 228/180 A; 428/304
[58] Field of Search ........... 428/209, 210, 304, 413, 428/417, 446, 474, 901; 427/386, 387, 385 A, 385 C; 228/6 A, 180 A

[56] References Cited

U.S. PATENT DOCUMENTS

| 2,816,348 | 12/1957 | Adamik | 427/387 |
|---|---|---|---|
| 2,912,382 | 11/1959 | Liao et al. | 427/386 |
| 3,079,282 | 2/1963 | Haller et al. | 428/901 |
| 3,419,412 | 12/1968 | Morris et al. | 427/386 |
| 3,471,312 | 10/1969 | Muenchinger et al. | 428/210 |
| 3,689,357 | 9/1972 | Jordan | 428/210 |
| 3,706,409 | 12/1972 | Lederer | 228/6 A |
| 3,803,075 | 4/1974 | Kray et al. | 428/474 |
| 3,958,317 | 5/1976 | Peart et al. | 428/210 |
| 4,020,206 | 4/1977 | Beil | 428/210 |
| 4,020,222 | 4/1977 | Kausche et al. | 428/210 |
| 4,021,100 | 5/1977 | Giglia | 350/357 R |

*Primary Examiner*—William J. Van Balen
*Attorney, Agent, or Firm*—Birch, Stewart, Kolasch & Birch

[57] ABSTRACT

A semiconductor wafer is supported by a supporting plate via adhesive in some steps of fabricating a semiconductor device. The supporting plate is a porous ceramic plate impregnated with or painted with resin such as epoxy resin, silicone resin and polyimide varnish. The porous ceramic supporting plate has a low thermal conductivity to ensure stable bonding operation.

5 Claims, 1 Drawing Figure

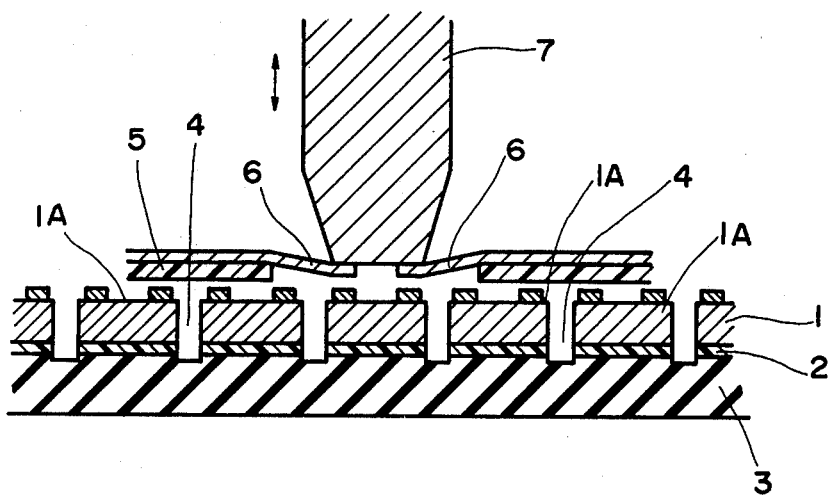

CERAMIC PLATE FOR SUPPORTING A SEMICONDUCTOR WAFER

BACKGROUND OF THE INVENTION

The present invention relates to a supporing plate for supporting a semiconductor wafer in some steps for fabricating a semiconductor device.

More specifically, the present invention relates to a supporting plate for supporing a semiconductor wafer and transporting the semiconductor wafer into, for example, the scribing station and the bonding station in the course of fabrication of the semiconductor device.

Generally, a semiconductor wafer having circuit elements and conductor wirings formed therein in a desired configuration is supported on a supporting plate via adhesive such as wax. The thus supported semiconductor wafer is transported into the scribing station, wherein the semiconductor wafer is divided into semiconductor chips through the use of a dicing saw. An electrode shaped metal leaf is placed to confront an electrode formed on the semiconductor chip in the bonding station, wherein the electrode shaped metal leaf is connected to the chip electrode through the use of a bonding tool.

Grooves formed in the scribing station reach the supporting plate. That is, the adhesive sandwiched between the semiconductor wafer and the supporting plate is also divided into the chip size.

The conventional supporting plate is made of glass, plastics or ceramics. The glass supporting plate has a high thermal conductivity and, therefore, the bonding tool must be heated to a considerably high temperature. Moreover, the heat energy is transferred to adjacent semiconductor chips through the glass supporting plate. The thus transferred heat energy melts the wax fixed to the adjacent semiconductor chips.

The plastic supporting plate can not tolerate a high temperature. Thus there is the possibility that the plastic supporting plate will bend during the bonding treatment.

The fine ceramic supporing plate has similar defects as the glass supporting plate. In the porous ceramic supporting plate, there is a possibility that the adhesive such as the wax permeates the inside of the porous ceramic supporting plate.

OBJECTS AND SUMMARY OF THE INVENTION

Accordingly, an object of the present invention is to provide a supporting plate for supporting a semiconductor wafer in a bonding station.

Another object of the present invention is to provide a supporting plate having a low thermal conductivity.

Other objects and further scope of applicability of the present invention will become apparent from the detailed description given hereinafter. It should be understood, however, that the detailed desciption and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a supporting plate is made of a porous ceramic plate impregnated with or painted with resin having a relatively low thermal conductivity. Preferred resin are, for example, an epoxy resin, a silicone resin or a polyimide varnish.

The porous ceramic plate has a low thermal conductivity. A semiconductor wafer is mounted on the porous ceramic plate via adhesive such as wax. The wax for fixing the semiconductor wafer to the porous ceramic plate will not permeate the porous ceramic plate, since the porous ceramic plate is impregnated with or painted with the resin.

BRIEF DESCRIPTION OF THE FIGURE

The present invention will become more fully understood from the detailed description given hereinbelow and the accompanying drawing which is given by way of illustration only, and thus is not limitative of the present invention and wherein, The single FIGURE of the drawing is a sectional view showing a bonding treatment conducted to a semiconductor chip supported by a supporting plate of the present invention.

DESCRIPTION OF THE PREFERRED EMBODIMENTS

A semiconductor wafer 1 is mounted on a supporting plate 3 via adhesive 2 such as wax. The semiconductor wafer 1 has circuit elements aligned in a desired repeating pattern. The circuit elements are previously formed through the use of conventional impurity diffusion techniques and an etching technique. Electrode terminals are also previously formed on the semiconductor wafer 1 in a desired configuration. The thus formed semiconductor wafer 1 is mounted on the supporting plate 3 and carried into a scribing station where it is divided into a plurality of semiconductor chips 1A.

The supporting plate 3 has a flat surface, and is made of a porous ceramic plate impregnated with or painted with a resin having a low thermal conductivity such as an epoxy resin, a silicon resin and a polyimide varnish.

A method for impregnating the porous ceramic plate with the epoxy resin is as follows. The porous ceramic plate is steeped in the heat-resisting epoxy resin of a low viscosity. The thus impregnated porous ceramic plate is heated to fix the epoxy resin. Then lapping is conducted to provide a supporting plate having a uniform thickness and a flat surface.

In a typical method for painting the surface of the porous ceramic plate with a resin, the polyimide varnish is painted on the surface of the porous ceramic plate through the use of a brush. In another method, the porous ceramic plate is coated with a resin through the use of an electrostatic painting method. In still another method, a para-xylene film is formed on the surface of the porous ceramic plate through the use of an evaporation technique. In yet another method, a photo-resist is painted on the surface of the porous ceramic plate through the use of a spinner.

The semiconductor chips 1A are separated from each other by scribed lines 4. The scribed lines 4 not only divide the semiconductor wafer 1 into the semiconductor chips 1A but also reach the supporting plate 3 through the adhesive layer 2.

The thus formed semiconductor chips 1A are transported into a bonding station, by the movement of the supporting plate 3, wherein lead electrodes for outer connection purposes are bonded to the electrode terminals of the respective semiconductor chips.

More specifically, a flexible film 5 such as a polyimide film carrying lead electrodes 6 formed thereon is placed above the semiconductor chip 1A so that the lead electrodes 6 confront the electrode terminals formed on the semiconductor chip 1A, respectively. Thereafter, the thus confronted portions are heated and brought into contact with each other by a bonding tool 7 so as to tightly connect the electrode terminals to the lead electrode 6.

In this bonding operation, the semiconductor chips adjacent to the semiconductor chip to which the bonding treatment is conducted are not influenced since the porous ceramic supporting plate 3 has a low thermal conductivity.

The flexible film 5 is slightly bent downward while the bonding tool 7 functions to depress the lead electrodes 6 toward the electrode terminals. The adhesive 2 is melted by the heat energy applied from the bonding tool 7. Therefore, when the depression force is released, the semiconductor chip 1A is separated from the supporting plate 3 and carried by the flexible film 5.

The invention being thus described, it will be obvious that the same may be varied in many ways. Such variations are not to be regarded as a departure from the spirit and scope of the invention, and all such modifications are intended to be included within the scope of the following claims

What is claimed is:

1. A supporting plate supporting a semiconductor wafer during the fabrication of a semiconductor device in at least the thermal bonding and the dicing sections of the device wherein said semiconductor wafer is fixed to said supporting plate by a heat-melting adhesive disposed therebetween, said semiconductor wafer being diced into a plurality of semiconductor chips, said supporting plate comprising a porous ceramic plate having a low thermal conductivity to prevent melting of said heat-melting adhesive between said semiconductor chips and supporting plate where said thermal bonding operation is not applied, said porous ceramic plate also being impregnated with or painted with a resinous material, said resinous material exhibiting a low thermal conductivity and functioning to prevent permeation of said adhesive into said plate.

2. The supporting plate of claim 1, wherein said resin is a silicone resin.

3. The supporting plate of claim 1, wherein said resin is a polyimide varnish.

4. The supporting plate of claim 1, wherein said resin is an epoxy resin.

5. The supporting plate of claim 1, wherein said adhesive is wax.

* * * * *